United States Patent [19]
Takakusaki

[11] Patent Number: 6,072,823
[45] Date of Patent: Jun. 6, 2000

[54] PSEUDO-RANDOM NOISE SERIES GENERATOR

[75] Inventor: Keiji Takakusaki, Yokohama, Japan

[73] Assignee: Matsushita Electric Industrial Co., Ltd., Osaka, Japan

[21] Appl. No.: 08/871,765

[22] Filed: Jun. 9, 1997

[30] Foreign Application Priority Data

Aug. 7, 1996 [JP] Japan .................................. 8-223284

[51] Int. Cl.[7] .............................. H04B 15/00; H04K 1/00; H04L 27/30; H03B 29/00
[52] U.S. Cl. ........................ 375/208; 375/200; 375/206; 375/209; 375/210; 331/78; 327/164; 708/250; 708/251; 708/252
[58] Field of Search .................................... 375/200, 206, 375/208, 209, 210; 331/78; 327/164; 708/250, 251, 252

[56] References Cited

U.S. PATENT DOCUMENTS

| 3,984,668 | 10/1976 | Zetterberg et al. ................. 364/717.01 |
| 4,047,008 | 9/1977 | Perkins ................................ 364/717.01 |
| 4,161,041 | 7/1979 | Butler et al. ............................ 365/244 |
| 4,386,411 | 5/1983 | Risk et al. . |
| 4,408,298 | 10/1983 | Ruhland ............................ 364/717.03 |
| 4,875,021 | 10/1989 | Sonetaka .................................... 331/78 |
| 4,901,264 | 2/1990 | Hayashi ............................. 364/717.01 |
| 5,463,334 | 10/1995 | Griffin et al. . |
| 5,488,658 | 1/1996 | Hirashima ................................. 380/14 |
| 5,920,591 | 7/1999 | Fukasawa et al. ....................... 375/208 |

FOREIGN PATENT DOCUMENTS

| 301383A2 | 2/1989 | European Pat. Off. . |
| 0519589A | 12/1992 | European Pat. Off. . |
| 3530760 | 3/1987 | Germany . |
| 786982 | 3/1995 | Japan . |
| 786984 | 3/1995 | Japan . |
| 799465 | 4/1995 | Japan . |

OTHER PUBLICATIONS

Copy of European Search Report dated Oct. 12, 1999.
Patent Abstracts of Japan, vol. 016, No. 364 (E–1244), Aug. 6, 1992 and JP 04 115616 A (Toshiba Corp.), Apr. 16, 1992.

*Primary Examiner*—Stephen Chin
*Assistant Examiner*—Michael W. Maddox
*Attorney, Agent, or Firm*—Stevens, Davis, Miller & Mosher, L.L.P.

[57] ABSTRACT

A pseudo-random noise series generator which can change the timing of generation of a PN series arbitrarily and with no instantaneous cut-off of the output. At the time of system start, the whole period or a certain beginning length of a PN series generated by a tapped shift register is stored into a RAM. The stored PN series is output from a position designated by an address signal. An address generator for generating the address signal on an externally applied timing control signal increments an address by one for each step from an initial value set by the timing control signal. In the case where a new timing different from the old timing is set by the timing control signal, the address is incremented or decremented instantaneously by a difference between the old timing and the new timing and a normal incrementing operation is thereafter started again. The thus generated address signal is applied to an address bus for the RAM, thereby making it possible to instantaneously change the timing of generation of a PN series output as required by the timing control signal.

14 Claims, 4 Drawing Sheets

PSEUDO-RANDOM NOISE SERIES GENERATOR

BACKGROUND OF THE INVENTION

1. Field of the Invention

The present invention relates to a pseudo-random noise (PN) series generator used in a digital radio communication technique, and more particularly to a PN series generator capable of changing the timing of generation of a PN series (or the phase of a generated PN series) arbitrarily and with no instantaneous cut-off of the output.

2. Description of the Related Art

The construction of the conventional PN series generator is shown in FIG. 4. A main component of the PN series generator is a tapped shift register (a shift register having taps) 401 whose internal construction is shown in FIG. 5. The register values of the shift register 501 at predetermined positions are added by a mod-2 adder 502 and the result of addition is fed back to the inlet of the shift register 501. When this system is operated by system clocks having a fixed rate, a PN series having a certain period and taking two values of "1" and "0" appears on an output terminal 503. This output is used as an output 402 of the PN series generator as it is.

When this PN series generator is used in a receiver of a radio communication system, there is indispensable a function of changing the timing of generation of a PN series so that it coincides with a received signal. In the case where where it is desired to advance the timing of generation of a PN series by one step, an advance or lead command signal 403 is applied one time from the exterior to operate the tapped shift register 501 at doubled-rate clocks by only one time. On the other hand, in the case where where it is desired to delay the timing of generation of a PN series by one step, a delay or lag command signal 404 is applied one time to stop the operation of the tapped shift register 501 by only one time.

However, the construction of the conventional PN series generator has a problem that it is only one step by one step which the timing of generation of a PN series output can be changed using the advance command signal 403 or the delay command signal 404.

In order to change the timing of generation of a PN series output by two or more steps, it is required that the advance command signal 403 or the delay command signal 404 should be applied plural times. Moreover, the change of the timing is not instantaneous or needs a time until the application of the advance command signal 403 or the delay command signal 404 by required times is completed. During that time, the PN series output cannot be used since a desired timing is not attained.

On the other hand, JP-A-7-86982 has disclosed a synchronous PN code series generating circuit in which the synchronization of a spread PN code series can be established simply between a plurality of communication channels in the case where the PN code series has a very long period. According to the JP-A-7-86982, a feedback shift register circuit common to the plurality of communication channels is provided to generate a PN code series and a shift register circuit of each communication channel generates a spread PN code series for that channel by multiplying the PN code series output from the feedback shift register circuit by mask information which is stored in a mask storage of that channel. However, this synchronous PN code series generating circuit aimed at the synchronization of a spread PN code series for each communication channel is irrelevant to the change of the timing of generation of one PN code series based on a control signal. Further, this synchronous PN code series generating circuit has a very complicated construction since it needs the feedback shift register circuit common to the plurality of communication channels as well as the shift register circuit and the mask storage for each communication channel.

Also, JP-A-7-86984 has disclosed a PN code generator in which PN codes in a spread spectrum communication system can be changed arbitrarily during communication. According to the JP-A-7-86984, a plurality of kinds of PN codes are set and written in a flash memory beforehand and a PN code changed on the basis of a send-and-receive agreement is read from the flash memory at the time of start of communication or at the time of communication. However, this PN code generator has a problem that a flash memory having a large storage capacity is required in order to store a plurality of kinds of PN codes.

Further, JP-A-7-99465 has disclosed an inverse spread code generating circuit in which the efficiency of synchronization capture of inverse spread codes is improved. According to the JP-A-7-99465, inverse spread codes stored in a ROM are read using an address which is incremented or decremented by an up counter or down counter. Therefore, this inverse spread code generating circuit is the same as the PN series generator explained in conjunction with FIG. 4 in that it is only one step by one step which the timing of generation of inverse spread codes can be changed.

SUMMARY OF THE INVENTION

An object of the present invention is to provide a PN series generator in which the above-mentioned problems are solved and a PN code series is generated with a more simple and small-scale construction and at an arbitrary timing.

A pseudo-random noise (PN) series generator according to one aspect of the present invention comprises a shift register for generating a predetermined length of PN series data at least at the time of system start, a memory for storing the predetermined length of PN series data generated by the shift register and outputting the stored PN series data from a position designated by an address signal, and an address generator for generating the address signal on the basis of a timing control signal applied from the exterior.

With this construction, it is possible to change the timing of generation of a PN series arbitrarily and with no instantaneous cut-off of the output.

DESCRIPTION OF THE PREFERRED EMBODIMENTS

Figure 1:
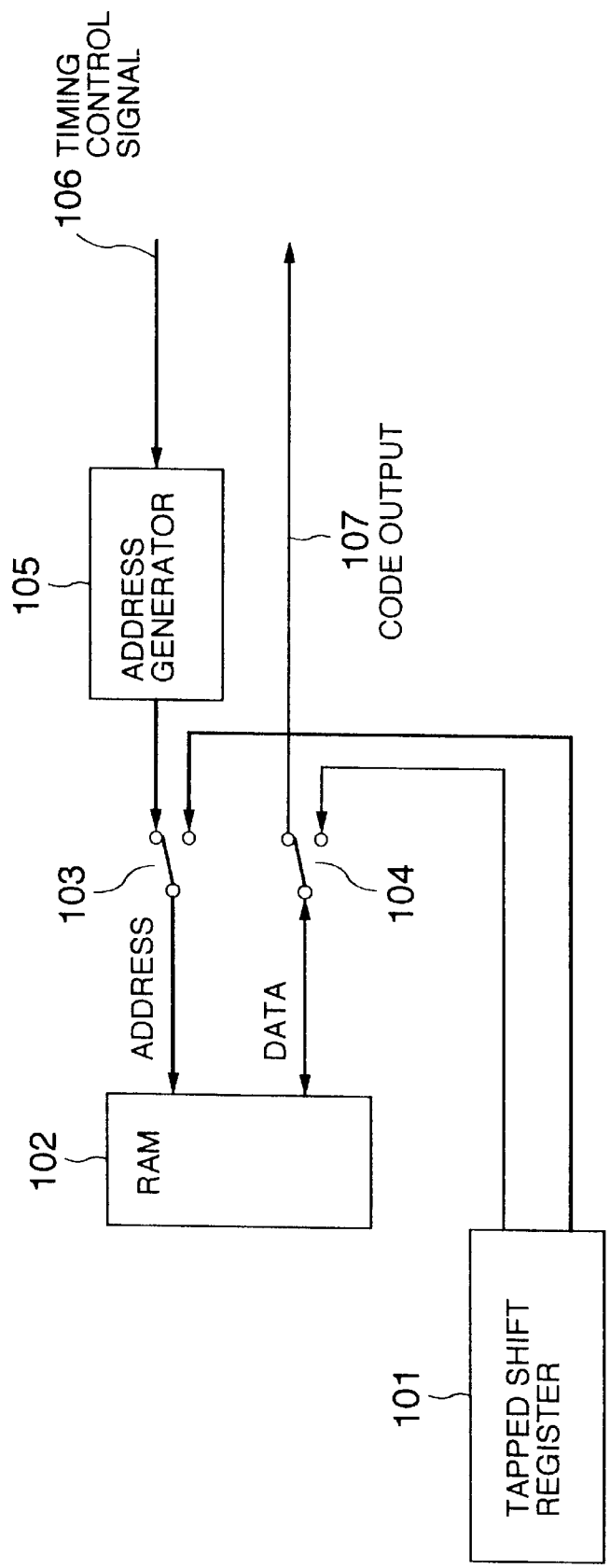
FIG. 1 is a diagram showing the construction of a PN code series generator according to a first embodiment of the present invention.

Embodiments of the present invention will now be described referring to the drawings.

(First Embodiment)

Figure 5:
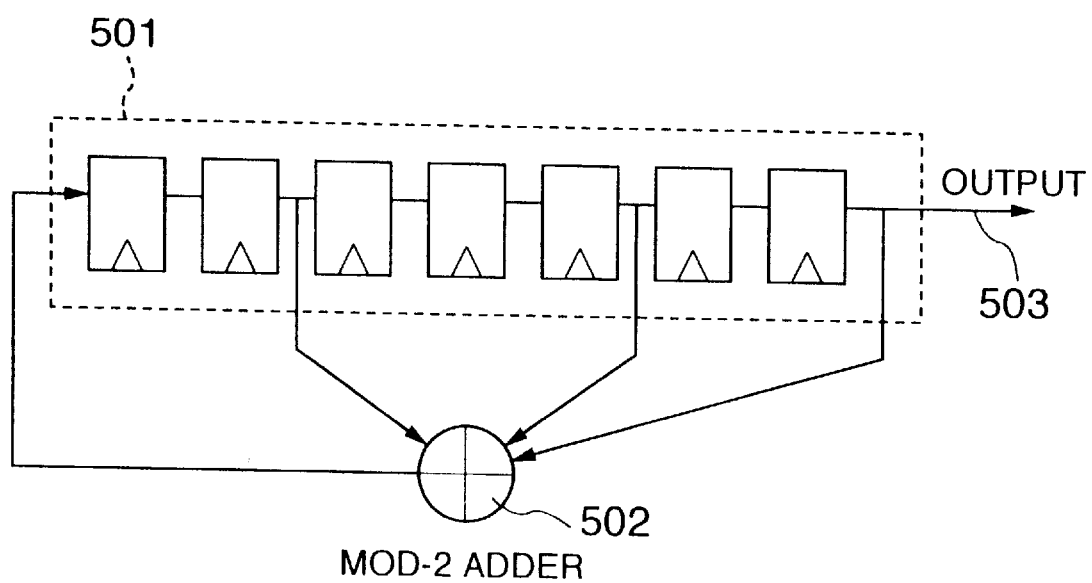
FIG. 5 is a diagram showing a specific example of a tapped shift register used in the conventional PN series generator shown in FIG. 4.

FIG. 1 is a diagram showing the construction of a PN series generator according to a first embodiment of the present invention. The PN series generator includes a tapped shift register 101 having a structure as shown in FIG. 5, a RAM (Random Access Memory) 102, a switch (or selector) 103 for change-over of address bus for RAM 102, a switch (or selector) 104 for change-over of data line for RAM 102, and an address generator 105 for generation of an address of the RAM 102. The PN series generator is applied with a timing control signal 106 from the exterior and provides a PN series output 107.

Next, the operation of the PN series generator according to the first embodiment will be explained using FIG. 1.

At the time of system start, the change-over switches 103 and 104 are connected to their shift register 101 sides. The whole of a PN series in one period is generated by the tapped shift register 101 and the whole of the generated PN series is stored into the RAM 102.

When the storage of the PN series into the RAM is completed, the change-over switch 103 is changed to the address generator 105 side while the change-over switch 104 is changed to the output terminal side.

The address generator 105 increments an address by one for each step from an initial value set by the timing control signal 106. In the case where a new timing different from the old timing is set by the timing control signal 106, the address is incremented or decremented instantaneously by a difference between the old timing and the new timing and a normal incrementing operation is thereafter started again.

The thus generated address signal is applied to the address bus for the RAM 102, thereby making it possible to instantaneously change the timing of generation of a PN series output as required by the timing control signal.

With the above-mentioned PN series generator according to the first embodiment of the present invention, it becomes possible to change the timing of generation of a PN series arbitrarily and with no instantaneous cut-off of the output.

(Second Embodiment)

Figure 2:
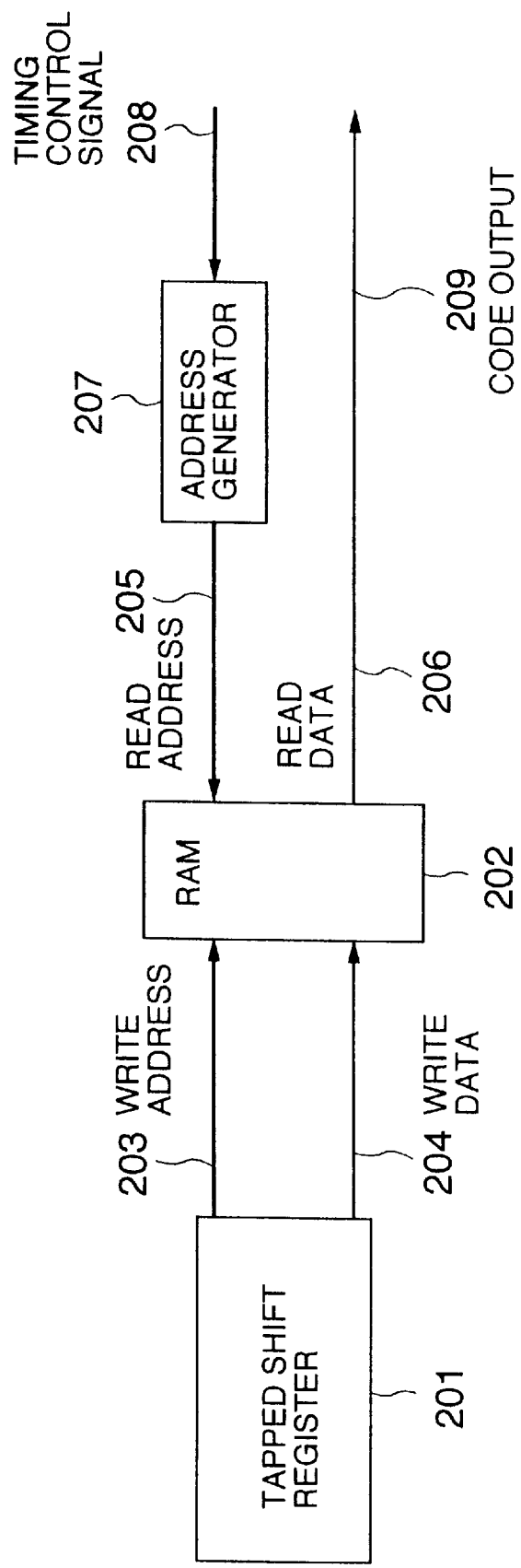
FIG. 2 is a diagram showing the construction of a PN code series generator according to a second embodiment of the present invention.

FIG. 2 is a diagram showing the construction of a PN series generator according to a second embodiment of the present invention. The PN series generator includes a tapped shift register 201 having a structure as shown in FIG. 5, a dual-port RAM or multi-face change-over RAM 202, a write address bus 203 for RAM 202, a write data line 204 for RAM 202, a read address bus 205 for RAM 202, a read data line 206 for RAM 202, and an address generator 207 for generation of an address of the RAM 202. The PN series generator is applied with a timing control signal 208 from the exterior and provides a PN series output 209. It is possible for the dual-port RAM or multi-face change-over RAM 202 to perform the writing and reading simultaneously through the write and read address buses.

Next, the operation of the PN series generator according to the second embodiment will be explained using FIG. 2.

At the time of system start, a PN series begins to be generated from the tapped shift register 201 and only a beginning portion of the generated PN series corresponding to a certain bit length L is stored into the RAM 202.

The address generator 207 increments an address by one for each step from an initial value set by the timing control signal 208. In the case where a new timing different from the old timing is set by the timing control signal 208, the address is incremented or decremented instantaneously by a difference between the old timing and the new timing and a normal incrementing operation is thereafter started again. The thus generated address signal is applied to the address bus for the RAM 202, thereby making it possible to instantaneously change the timing of generation of a PN series output as required by the timing control signal.

While data is read from the RAM 202, a PN series to be used in the future is generated by the tapped shift register 201 so that it is supplied into the RAM 202. Thereby, a PN series of a certain bit length (L on the average) is always buffered in the RAM 202. The reading of the PN series can be performed at a completely free timing so long as it is within the certain bit length.

Further, it is not required that the PN series over the whole of one period should be stored in the RAM as in the PN series generator of the first embodiment. Therefore, even if a RAM having a limited size is used, no limitation is imposed on the period of a PN series which can be generated.

With the above-mentioned PN series generator according to the second of the present invention, it becomes possible to change the timing of generation of a PN series arbitrarily and with no instantaneous cut-off of the output. In addition, there is eliminated a limitation imposed on the period of a PN series which can be generated.

(Third Embodiment)

Figure 3:
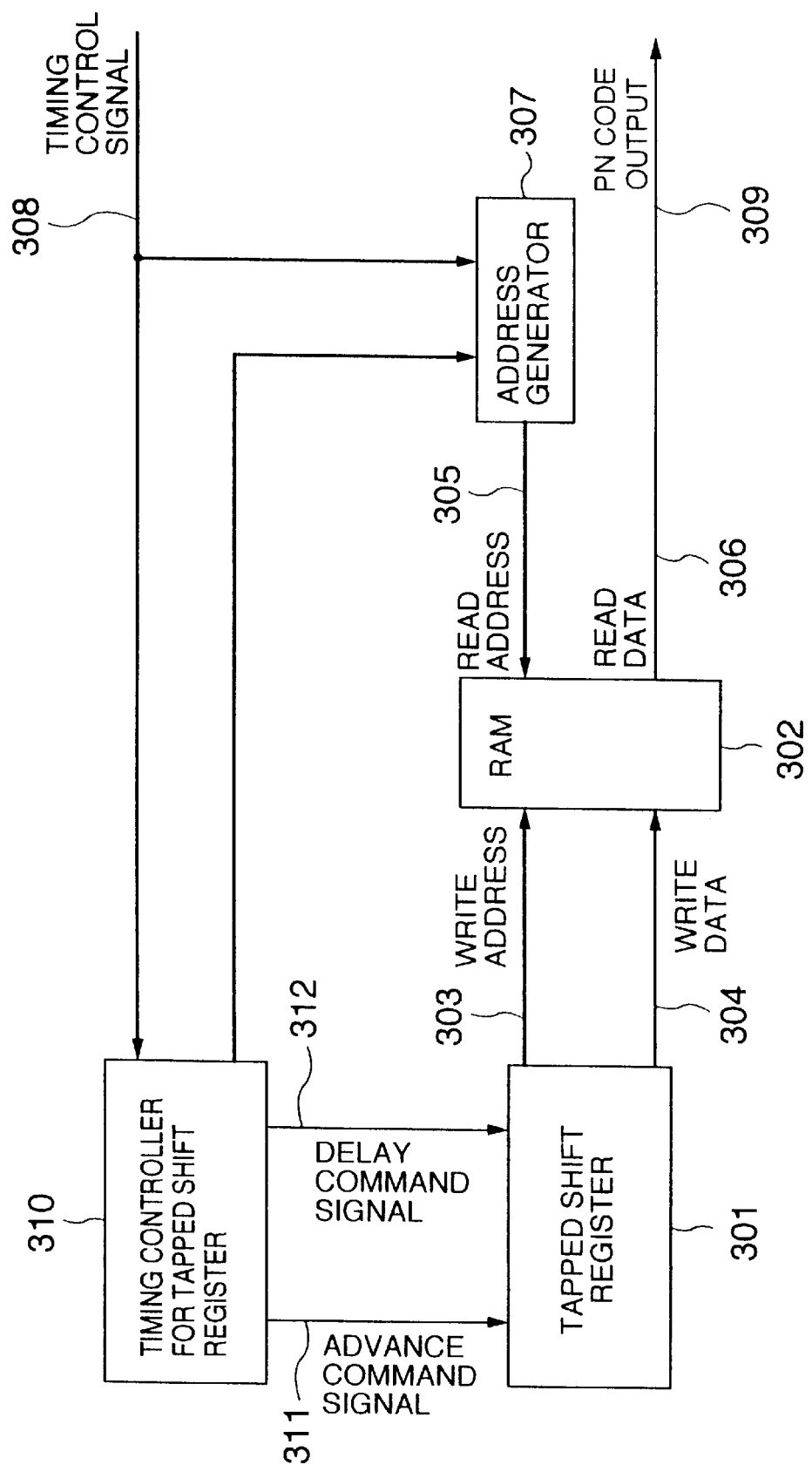
FIG. 3 is a diagram showing the construction of a PN code series generator according to a third embodiment of the present invention.
Figure 4:
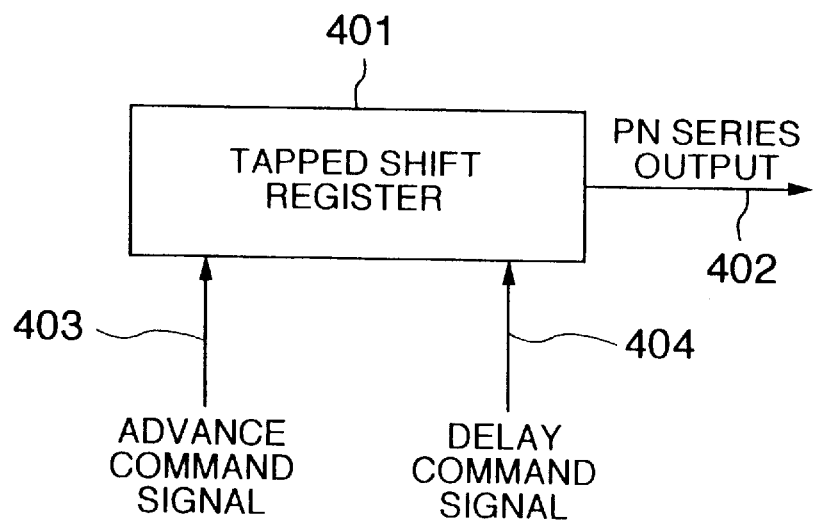
FIG. 4 is a diagram showing the construction of the conventional PN series generator.

FIG. 3 is a diagram showing the construction of a PN series generator according to a third embodiment of the present invention. The PN series generator includes a tapped shift register 301 having a structure as shown in FIG. 5, a dual-port RAM or multi-face change-over RAM 302, a write address bus 303 for RAM 302, a write data line 304 for RAM 302, a read address bus 305 for RAM 302, a read data line 306 for RAM 302, an address generator 307 for generation of an address of the RAM 302, and a timing controller or adjuster 310 for the tapped shift register. The PN series generator is applied with a timing control signal 308 from the exterior and provides a PN series output 309. Further, an advance command signal 311 and a delay command signal 312 for the tapped shift register 301 are given. It is possible for the dual-port RAM or multi-face change-over RAM 302 to perform the writing and reading simultaneously through the write and read address buses.

Next, the operation of the PN series generator according to the third embodiment will be explained using FIG. 3.

At the time of system start, a PN series begins to be generated by the tapped shift register 301 and only a beginning portion of the generated PN series corresponding to a certain bit length L is stored into the RAM 302.

The address generator 307 increments an address by one for each step from an initial value set by the timing control signal 308. In the case where a new timing different from the old timing is set by the timing control signal 308, the address is incremented or decremented instantaneously by a difference between the old timing and the new timing and a normal incrementing operation is thereafter started again. The thus generated address signal is applied to the address bus for the RAM 302, thereby making it possible to instantaneously change the timing of generation of a PN series output as required by the timing control signal.

While data is read from the RAM 302, a PN series to be used in the future is generated by the tapped shift register 301 so that it is supplied into the RAM 302. Thereby, a PN series of a certain bit length (L on the average) is always buffered in the RAM 302. The reading of the PN series can be performed at a completely free timing so long as it is within the certain bit length.

Further, it is not required that the PN series over the whole of one period should be stored in the RAM as in the PN series generator of the first embodiment. Therefore, even if a RAM having a limited size is used, no restriction is imposed on the period of a PN series which can be generated.

In the case of the PN series generator according to the second embodiment, the width or range of adjustment for the timing of the generated PN series is limited to the length of PN series data which can be stored in the RAM. In the third embodiment, in order to adjust the timing beyond this limitation, the following process is performed.

The timing control signal 308 is also supplied to the timing adjuster 310 for the tapped shift register. In the case where the advance of timing is yet requested notwithstanding that the store in the RAM 302 runs short, that is, in the case where the output of a PN series at a more fast timing than the timing of generation of a PN series by the tapped shift register 301 is requested, the timing adjuster 310 for tapped shift register applies an advance command signal 311 to the tapped shift register 301 to advance the timing of generation of a PN series by the tapped shift register 301 and at the same time instructs the address generator 307 to advance the timing of reading. By repeating this operation N times, the PN series stored in the RAM 302 is increased by an amount corresponding to N steps. Thereby, the further advance adjustment corresponding to N steps becomes possible after this.

In the case where the delay of timing beyond the possible storage amount of the RAM 302 is requested, the timing adjuster 310 for tapped shift register applies a delay command signal 312 to the tapped shift register 301 to delay the timing of generation of a PN series by the tapped shift register 301 and at the same time instructs the address generator 307 to delay the timing of reading. By repeating this operation N times, the PN series stored in the RAM 302 is decreased by an amount corresponding to N steps. Thereby, the further delay adjustment corresponding to N steps becomes possible after this.

With the above-mentioned PN series generator according to the third embodiment of the present invention, it becomes possible to change the timing of generation of a PN series arbitrarily and without instantaneously cutting off the output. In addition, there are eliminated a limitation on the period of a PN series which can be generated and a limitation on the width of timing adjustment.

As apparent from the foregoing explanation of the embodiments, the present invention provides an effect that the timing of generation of a PN series can be changed arbitrarily and with no instantaneous cut-off of the output.

I claim:

1. A pseudo-random noise series generator comprising:
   a shift register for generating a predetermined length of pseudo-random noise series data at least at the time of system start;
   a memory for storing the predetermined length of pseudo-random noise series data generated by said shift register and outputting the stored pseudo-random noise series data from a position designated by an address signal; and
   an address generator for generating said address signal on the basis of a timing control signal applied from the exterior.

2. A pseudo-random noise series generator according to claim 1, wherein said shift register generates a whole period of pseudo-random noise series data, and said memory stores the whole period of the pseudo-random noise series generated by said shift register.

3. A pseudo-random noise series generator according to claim 2, further comprising:
   a first selector for connecting a data input/output line of said memory to a data output line of said shift register when the pseudo-random noise series data is to be stored and connecting the data input/output line of said memory to an external output line when the pseudo-random noise series data is to be read; and
   a second selector for connecting an address signal input line of said memory to an address signal output line of said shift register when the pseudo-random noise series data is to be stored and connecting the address signal input line of said memory to an output line of said address generator when the pseudo-random noise series data is to be read.

4. A pseudo-random noise series generator according to claim 1, wherein said memory outputs the stored pseudo-random noise series data from the position designated by said address signal while successively storing the pseudo-random noise series data generated by said shift register.

5. A pseudo-random noise series generator according to claim 4, wherein said memory includes a dual-port RAM (random access memory) which has a data input line connected to a data output line of said shift register, a data output line connected to an external output line, an address signal input line connected to an address signal output line of said shift register, and an address signal input line connected to an output line of said address generator.

6. A pseudo-random noise series generator according to claim 4, further comprising timing control means for controlling the timing of generation of the pseudo-random noise series data by said shift register on the basis of said timing control signal while controlling said address generator to generate an address signal corresponding to the generated pseudo-random noise series data, thereby eliminating a limitation on a range for adjustment of the timing of the pseudo-random noise series data output from the pseudo-random noise series generator.

7. A pseudo-random noise series generator according to claim 6, wherein said memory includes a dual-port RAM which has a data input line connected to a data output line of said shift register, a data output line connected to an external output line, an address signal input line connected to an address signal output line of said shift register, and an address signal input line connected to an output line of said address generator.

8. A pseudo-random series noise generator according to claim 1, wherein said shift register is a tapped shift register.

9. A pseudo-random series noise generator according to claim 2, wherein said shift register is a tapped shift register.

10. A pseudo-random series noise generator according to claim 3, wherein said shift register is a tapped shift register.

11. A pseudo-random series noise generator according to claim 4, wherein said shift register is a tapped shift register.

12. A pseudo-random series noise generator according to claim 5, wherein said shift register is a tapped shift register.

13. A pseudo-random series noise generator according to claim 6, wherein said shift register is a tapped shift register.

14. A pseudo-random series noise generator according to claim 7, wherein said shift register is a tapped shift register.

* * * * *